(12) United States Patent
Komatsubara

(10) Patent No.: US 6,553,339 B1
(45) Date of Patent: Apr. 22, 2003

(54) MOSFET SIMULATION METHOD

(75) Inventor: Hirotaka Komatsubara, Tokyo (JP)

(73) Assignee: Oki Electric Industry Co, Ltd., Tokyo (JP)

(*) Notice: Subject to any disclaimer, the term of this patent is extended or adjusted under 35 U.S.C. 154(b) by 0 days.

(21) Appl. No.: 09/395,222

(22) Filed: Sep. 14, 1999

(30) Foreign Application Priority Data

Sep. 14, 1998 (JP) .......................................... 10-260702

(51) Int. Cl.$^7$ ............................................. G06F 17/50
(52) U.S. Cl. .................................. 703/14; 703/2; 716/4
(58) Field of Search ............................ 703/1–2, 13–22; 716/1–4, 20

(56) References Cited

U.S. PATENT DOCUMENTS

| | | | | |
|---|---|---|---|---|
| 5,615,377 A | * | 3/1997 | Shimizu et al. ............. | 324/765 |
| 5,828,586 A | | 10/1998 | Yokota ........................ | 716/20 |
| 5,889,687 A | * | 3/1999 | Enda ........................... | 703/12 |

FOREIGN PATENT DOCUMENTS

| | | |
|---|---|---|
| JP | 10004191 A | 1/1998 |

OTHER PUBLICATIONS

Villa et al, "A Physically–Based Model of the Effective Mobility in Heavily–Doped n–MOSFET's", IEEE Transactions on Electron Devices, vol. 45 No. 1, pp. 110–115 (Jan. 1998).*

Agostinelli, Jr. et al, "Universal MOSFET Hole Mobility Degradation Models for Circuit Simulation", IEEE Transactions on Computer–Aided Design of Integrated Circuits and Systems, vol. 12 No. 3, pp. 439–445 (Mar. 1993).*

Claudio Lombardi et al. "A Physically Based Mobility Model for Numerical Simulation of Nonplanar Devices". IEEE Transactions on Computer–Aided Design, vol. 7, No. 11, Nov. 1988 (4 Pages).

* cited by examiner

*Primary Examiner*—Samuel Broda
(74) *Attorney, Agent, or Firm*—Rabin & Berdo, P.C.

(57) ABSTRACT

A MOSFET simulation method for calculating a characteristic value of a MOSFET to be simulated by first numerically calculating the electric potential, electron density, hole density, and mobility inside the MOSFET from simulation conditions including various parameters of the MOSFET, and then using the electric potential, electron density, hole density, and carrier mobility is provided. This method has the first step of calculating the carrier mobility $\mu$ using, of the simulation conditions, the impurity concentration N, temperature T, vertical electric field Ev, and substrate voltage Vb, from the equation $\mu(N, T, Ev, Vb) = \mu 0(N, T, Ev) + \mu 1(Vb)$, and the second step of calculating the electric potential $\psi$, electron density n, hole density p using the carrier mobility $\mu$ by solving the system of simultaneous equations made of a Poisson equation, the equation of continuity of electrons the equation of continuity of holes, the electron transport equation, the hole transport equation, for the electric potential, electron density, and hole density.

8 Claims, 13 Drawing Sheets

MOSFET SIMULATION METHOD

BACKGROUND OF THE INVENTION

1. Field of the Invention

The present invention relates to a semiconductor device simulation method, in particular, to a simulation method which evaluates the device characteristics of a MOSFET (Metal-Oxide Semiconductor Field-Effect-Transistor) with a higher degree of accuracy and at a higher speed by a numerical simulation.

2. Description of Related Art

In a simulation, distributions of electric potential, electron density, and hole density inside the device when a voltage is applied to the electrodes under a preset device configuration or impurity distribution are obtained numerically. Using these numerical values, the current, the distribution of the electric field, and the electrode current inside the device are obtained. In general, a system of simultaneous equations consisting of the following Poisson equation, equation of continuity of electrons, equation of continuity of holes, electron transport equation, and hole transport equation is solved for electric potential $\psi$, electron density n, and hole density p.

Poisson equation $$\mathrm{div}(-\epsilon \mathrm{grad}(\psi)) = q(p - n + Nd - Na) \quad (1)$$

Equation of continuity of electrons $$\mathrm{div}(Jn) = q(R - G) \quad (2)$$

Equation of continuity of holes $$\mathrm{div}(Jp) = -q(R - G) \quad (3)$$

Electron transport equation $$Jn = -q^*(\mu n^* n^* \mathrm{grad}(\psi) - Dn^* \mathrm{grad}(n)) \quad (4)$$

Hole transport equation $$Jp = -q^*(\mu p^* p^* \mathrm{grad}(\psi) + Dp^* \mathrm{grad}(p)) \quad (5)$$

where $\epsilon$: permittivity of the medium, $\psi$: electric potential (potential), Nd: donor density, Na: acceptor density, R: carrier re-coupling amount, G: carrier generation amount, n: electron density, p: hole density, $\mu$n: electron mobility, $\mu$p: hole mobility, Dn: electron diffusion coefficient, Dp: hole diffusion coefficient, Jn: electron current density, Jp: hole current density, q: unit electric charge.

Moreover, the electron diffusion coefficient Dn and the hole diffusion coefficient Dp satisfy the following equations, respectively.

$$Dn = \mu n^* k^* T / q$$

$$Dp = \mu p^* k^* T / q$$

where k: Boltzmann constant, and T: temperature.

According to the conventional simulation method, a given MOS type semiconductor device is divided into many micro regions. Moreover, mesh points (or grid points) are placed on each of the micro regions. Next, the electric potential, a electron density, and hole density at each of the mesh points are calculated. It is interpreted that these electric potential, electron density, and hole density at each of the mesh points represent the electric potential, electron density, and hole density in the micro region. By connecting the electric potentials, electron densities, and hole densities in all the micro regions, the distributions of electric potential, electron density, and hole density throughout the MOS type semiconductor device are calculated.

Next, a MOSFET structure simulator according to the prior art will be explained.

This MOSFET structure simulator has an input means to which simulation conditions such as the shape of the semiconductor device, the distribution of impurities, temperature, input voltage, and the like are input, a characteristic calculation means which calculates the device characteristics of the semiconductor device by solving prescribed equations of device physics based on the distribution information provided from the input setting means, and a judging means which judges whether the characteristics value calculated by the characteristic calculation means has converged or not. In some cases, an output means which outputs information containing the calculation result produced by the characteristic calculation means in a prescribed form is installed in the apparatus, and the entire configuration including the output means is called a simulator. The expression "the characteristics value has converged" refers to a state in which the amount of change of the characteristic value that changes in accordance with the simulation process has reached below a prescribed level.

The following calculations are carried out in the above-described characteristics calculation means.

(1) Discretization of the semiconductor device into mesh points (2) Setting the initial values of the electric potential $\psi$, electron density n, and hole density p (3) Calculation of the vertical electric field Ev of the semiconductor device from the initial values of the electric potential $\psi$, electron density n, and hole density p (4) Calculation of the carrier mobility $\mu$ from the impurity concentration N, temperature T of the semiconductor device, and vertical electric field Ev (5) Calculation of the electric potential $\psi$, electron density n, and hole density p at each mesh point from the vertical electric field Ev and the carrier mobility $\mu$ (6) Calculation of the electron current density Jn and hole current density Jp from the electric potential $\psi$, electron density n, hole density p, and carrier mobility $\mu$ at each mesh point (7) Calculation of the value of the electric current from the electron current density Jn and hole current density Jp Next, the simulation method with the above-described MOSFET structure simulator will be explained with reference to the flow chart shown in FIG. 8.

First, conditions required for the simulation such as the shape of the semiconductor, the distribution of impurities, temperature, and the like are input to the input means (step S501).

Next, prescribed calculations are carried out by the characteristic calculation means. First, the semiconductor device is divided into meshes (step S502). Next, the initial values of the electric potential $\psi$, electron density n, and hole density p are set based on the conditions defined in the simulation condition input process (step S501) (step S503). Using these values, the vertical electric field Ev of the semiconductor device is calculated (step S504).

Next, the carrier mobility $\mu$ is calculated from the impurity concentration N, temperature T of the semiconductor device, and vertical electric field Ev obtained in the previous process (step S505). The electric potential $\psi$, electron density n, and hole density p at each mesh point are then calculated from the vertical electric field Ev and the carrier mobility μ obtained in the previous process (step S506). Next, the electron current density Jn and hole current density Jp are calculated at each mesh point from the electric potential ψ, electron density n, hole density p, and carrier mobility μ using equations (4) and (5) (step S507). Moreover, the value of the electric current that flows through each terminal is obtained from the electron current density in and hole current density Jp calculated in the previous process (step S508).

Next, the judging means judges whether the value of the electric current calculated in the previous process by the characteristic calculation means has converged or not. First, it is judged whether the difference between the amount of the incoming current and the amount of the outgoing current lies in a prescribed convergence condition range or not (step S509). If the difference does not lie in the prescribed convergence condition range, the characteristic value calculation is repeated re-starting from the vertical electric field calculation process (step S504) using the electric potential ψ, electron density n, and hole density p as the initial values obtained in the electric potential ψ, electron density n, and hole density p calculation process (step S506). If the difference lies in the prescribed convergence condition range, the device characteristic of the semiconductor device is evaluated using the electric current value.

The simulation information and the characteristic value of the semiconductor device obtained in the previous processes are output and displayed by an output device inside the simulator or another output device.

It should be noted that, in a MOS type semiconductor device, the characteristic value in the neighborhood of the interface between the insulating material of the MOS semiconductor device and the semiconductor (hereafter, this will be referred to as "insulating material/semiconductor interface") significantly influences the characteristic of the semiconductor device. Therefore, the carrier mobility μ on the insulating material/semiconductor interface needs to be calculated precisely.

Here, in the carrier mobility μ calculation process (step S505), the carrier mobility μ is defined as a function of the impurity concentration N, temperature T of the semiconductor device, and vertical electric field Ev. Many forms of this function are known. According to the prior art, the carrier mobility μ is calculated from an empirically derived equation. However, in the experiment, the carrier mobility μ at each mesh point of the semiconductor device cannot be measured. Instead, only the average carrier mobility in the inversion layer formed in the neighborhood of the insulating material/semiconductor interface can be measured. Therefore, a method for calculating the carrier mobility μ at each mesh point based on the experimentally obtained average mobility is needed. As an exemplary such method, as disclosed in the Japanese Patent Laid Open No. H10-4191, the method that uses the following Shin's equation is known.

$$\mu(Ev) = \mu\text{eff}(E\text{eff}) + (Ev - E0) d\mu\text{eff}(E\text{eff})/dEv \quad (6)$$

where, μeff: the average mobility in the inversion layer formed in the insulating material/semiconductor interface, Eeff=ηEv+(1−η)E0 (effective vertical electric field), E0: vertical electric field outside the inversion layer, Ev: vertical electric field at mesh pint, η=½ (in the case of electrons), η=⅓ (in the case of holes).

The method disclosed in the reference C. Lombmdi et al., "A Physically Based Mobility Model For Numerical Simulation of Non Planer Devices". IEEE Trans. CAD., vol. 7, 1164–1171, 1988 is another method for calculating the carrier mobility at each mesh point based on experimentally obtained average carrier mobility. In this reference, the carrier mobility μ at each mesh point is given by the following equation (7).

$$1/\mu(Ev, N, T) = 1/(b/Ev + c1*N^{c2}(T*Ev)) + (Ev)^2/d + 1/\mu2(N, T) \quad (7)$$

where, μ2(N, T) is a prescribed function that depends on N and T, and b=3.1*10^8,
c1=3.0*10^7,
c2=13, and
d=6*10^14.

However, when the carrier mobility μ is calculated using these parameters, the obtained carrier mobility μ can deviate significantly from the actual carrier mobility. Hence, the measured value is reproduced using a matching means which judges whether the calculated electric current value agrees with the measured electric current value. In this way, the device characteristic can be simulated with a higher degree of accuracy. A simulation in which a matching judging means is used will be explained with reference to the flow chart shown in FIG. 3. The matching means has an agreement judging means which judges whether the electric current value calculated by the simulator agrees with the measured electric current value or not. Using this matching means, agreement judging process (step S610) which judges whether the electric current value calculated by the simulator agrees with the measured electric current value or not is performed after the simulator convergence judging process (step S609) is completed as shown in FIG. 9.

If it is judged that the electric current value calculated by the simulator does not agree with the measured electric current value obtained in the agreement judging process (step S610), parameter change process (step S611) for changing the parameters for the carrier mobility μ calculation equation in the carrier mobility μ calculation process (step S605) is carried out. For example, when equation (7) is used for the carrier mobility μ calculation equation, the parameters b, c1, c2, and d are changed. The parameter change process may be performed by the characteristic calculation means or matching means. After the parameter change process (step S611) is completed, the processes starting from the simulation condition input process (step S601) are repeated.

The above-described simulator and simulation in which the matching means is used has the following problems. FIG. 10 shows the current-voltage characteristic of the simulation result in which values measured from an N-type MOSFET (hereafter, this will be referred to as NMOS) and a matching means were used. The vertical axis represents the drain current Id, and the horizontal axis represents the gate voltage Vg. The matching means is characterized in that it reproduces the measured current values. The measured current values are reproduced satisfactorily when the voltage Vb applied to the back surface of the substrate (hereafter, this voltage will be referred to as substrate voltage) is 0. However, when the substrate voltage Vb is −3V, the simulation result deviates significantly from the measured values.

FIG. 11 shows the current ratio and the carrier ratio in the case the substrate voltage Vb is 0V and in the case the substrate voltage Vb is −3V. As shown in FIG. 11, the ratio between the simulated carrier amount in the case the substrate voltage Vb is 0V and the simulated carrier amount in the case the substrate voltage Vb is −3V agrees approximately with the ratio between the measured carrier amount in the case the substrate voltage Vb is 0V and the measured carrier amount in the case the substrate voltage Vb is −3V regardless of the gate voltage Vg.

FIG. 12 shows the distribution of the carrier mobility $\mu$ with respect to the distance X from the insulation material/semiconductor interface. FIG. 13 shows the distribution of the vertical electric field Ev with respect to the distance X from the insulation material/semiconductor interface. As shown in FIG. 12, on the insulation material/semiconductor interface, the carrier mobility $\mu$ at Vb=0V differs very little from the carrier mobility $\mu$ at Vb=−3V. However, off the insulation material/semiconductor interface, the carrier mobility $\mu$ at Vb 0V differs significantly from the carrier mobility $\mu$ at Vb=−3V. This phenomenon is caused by the difference between the distribution of the vertical electric field Ev in the neighborhood of the insulation material/semiconductor interface when Vb=0V and the distribution of the vertical electric field Ev in the neighborhood of the insulation material/semiconductor interface when Vb=−3V as shown in FIG. 13.

However, no parameter that can correct the vertical electric field Ev while the mobility is calculated or depends on the substrate voltage exists. Hence, according to the prior art, it is difficult to achieve simultaneous fitting of the electric current characteristic that depends on the substrate voltage.

SUMMARY OF THE INVENTION

Given these problems, it is an object of the present invention to provide a simulation method and a simulator capable of reproducing the electric current characteristic that depends on the substrate voltage easily and accurately, solving these problems.

SUMMARY OF THE INVENTION

Figure 1:
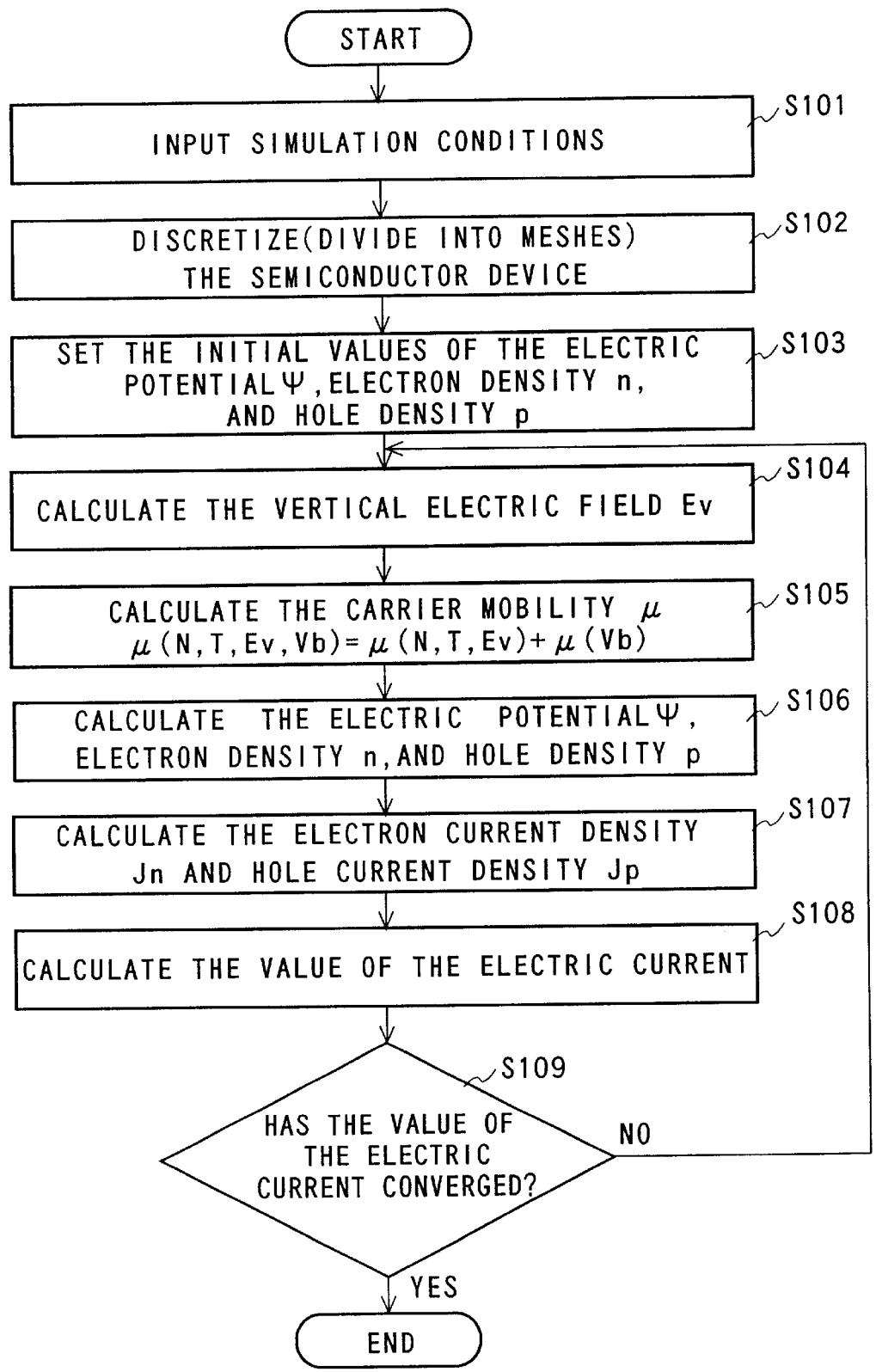
FIG. 1 shows a flow chart for operating the semiconductor device simulator according to the first embodiment.

To solve the above-stated problem, a semiconductor simulation method for calculating a characteristic value of the semiconductor to be simulated by first numerically calculating the electric potential, electron density, hole density, and mobility inside the semiconductor from simulation conditions including various parameters of the semiconductor, and then using the electric potential, electron density, hole density, and mobility is provided. This method has the first process of setting the simulation conditions, the second process of discretizing the semiconductor device to be simulated into mesh points, the third process of setting the initial values of the electric potential, electron density, and hole density, the fourth process of calculating the vertical electric field of the semiconductor device from the initial values of the electric potential, electron density, and hole density, the fifth process of calculating the mobility from the impurity concentration, temperature of the semiconductor device, vertical electric field, and the substrate voltage, the sixth process of calculating the electric potential, electron density, and hole density at each mesh point from the vertical electric field obtained in the fourth process and the mobility obtained in the fifth process, the seventh process of calculating the electron current density and hole current density from the electric potential, electron density, hole density at each mesh point obtained in the sixth process and the mobility obtained in the fifth process, the eighth process of calculating the value of the electric current from the electron current density and hole current density obtained in the seventh process, and the ninth process of judging whether the value of the electric current calculated in the eighth process has converged or not, and repeating the fourth through eighth processes until the value of the electric current converges.

In the fifth process, as stated in claim 1, the carrier mobility $\mu$ may be calculated using the impurity concentration N in the MOSFET, temperature T, vertical electric field Ev, and substrate voltage Vb, from the equation $\mu(N, T, Ev, Vb)=\mu 0(N, T, Ev)+\mu 1((Vb)$.

In this case, $\mu 0(N, T, Ev)$ is given, for example, by $$1/\mu 0(Ev, N, T)=1/(b/Ev+c1*N^{c2}/(T*Ev))+(Ev)^2/d+1/\mu 2(N, T)$$

where b, c1, c2, and d are prescribed constants, and $\mu 2(N, T)$ is a prescribed function that depends on N and T. Moreover, $\mu 1(Vb)$ is given, for example, by $\mu 1(Vb)=aVb$, where a is a prescribed constant.

Moreover, the electric potential $\psi$, electron density n, and hole density p are calculated using the carrier mobility $\mu$ by solving the following system of simultaneous equations for the electric potential $\psi$, electron density n, hole density p.
Poisson equation:

$$\mathrm{div}(-\epsilon\mathrm{grad}(\psi))=q(p-n+Nd-Na)$$

Equation of continuity of electrons:

$$\mathrm{div}(Jn)=q(R-G)$$

Equation of continuity of holes:

$$\mathrm{div}(Jp)=-q(R-G)$$

Electron transport equation:

$$Jn=-q*(\mu n*n*\mathrm{grad}(\psi)-Dn*\mathrm{grad}(n))$$

Hole transport equation:

$$Jp=-q*(\mu p*p*\mathrm{grad}(\psi)+Dp*\mathrm{grad}(p))$$

Here, $\epsilon$ is the permittivity of the medium, $\psi$ is the electric potential (potential), Nd is the donor density, Na is the acceptor density, R is the carrier re-coupling amount, G is the carrier generation amount, $\mu n$ is the electron mobility, $\mu p$ is the hole mobility, Dn is the electron diffusion coefficient, Dp is the hole diffusion coefficient, Jn is the electron current density, Jp is the hole current density, and q is the unit electric charge. Further, Dn is the electron diffusion coefficient, Dp is the hole diffusion coefficient, k is Boltzmann constant, and T is temperature.

According to this simulation method, the term whose argument is the substrate voltage Vb is added to the carrier mobility $\mu$ calculation function used in the carrier mobility calculation process. As a result, the carrier mobility that depends on the substrate voltage can be reproduced.

Moreover, it is desirable that the vertical electric field be a surface electric field on the interface of the insulating material of the MOSFET and the semiconductor.

According to this simulation method, the amount of change of the vertical electric field in the neighborhood of the insulation material/semiconductor interface, which is caused by the application of the substrate voltage, can be reduced. As a result, the current characteristic dependent on the substrate voltage can be reproduced.

DETAILED DESCRIPTION OF THE INVENTION

In what follows, with reference to the attached drawings, preferred embodiments of simulation methods and simulators according to the present invention will be explained in detail. In the present specification and drawings, the same reference numerals are given to those constitutive components that have substantially the same functions. Such components will not be explained repeatedly.

First Embodiment

First, a simulator according to the first embodiment will be explained. This simulator is obtained by adding a prescribed function of the substrate voltage Vb to the carrier mobility $\mu$ calculation function, which is used in the carrier mobility $\mu$ calculation process, of the conventional simulator. This simulator is a MOSFET structure simulator that is characterized in that it is capable of calculating the carrier mobility $\mu$ that depends on the substrate voltage Vb.

This MOSFET structure simulator has an input means to which simulation conditions such as the shape of the semiconductor device, the distribution of impurities, temperature, input voltage, and the like are input, a characteristic calculation means which calculates the device characteristics of the semiconductor device by solving prescribed equations of device physics based on the distribution information from the input setting means, and a judging means which judges whether the characteristics value calculated by the characteristic calculation means has converged or not. In some cases, an output means which outputs information containing the calculation result produced by the characteristic calculation means in a prescribed form is installed in the apparatus, and the entire configuration including the output means is called a simulator.

The following calculations are carried out in the above-described characteristics calculation means.
(1) Discretization of the semiconductor device into mesh points
(2) Setting the initial values of the electric potential $\psi$, electron density n, and hole density p
(3) Calculation of the vertical electric field Ev of the semiconductor device from the initial values of the electric potential $\psi$, electron density n, and hole density p
(4) Calculation of the carrier mobility $\mu$ from the impurity concentration N, temperature T of the semiconductor device, vertical electric field Ev, and the substrate voltage Vb
(5) Calculation of the electric potential $\psi$, electron density n, and hole density p at each mesh point from the vertical electric field Ev and the carrier mobility $\mu$
(6) Calculation of the electron current density Jn and hole current density Jp from the electric potential $\psi$, electron density n, hole density p, and carrier mobility $\mu$ at each mesh point
(7) Calculation of the value of the electric current from the electron current density Jn and hole current density Jp In the carrier mobility $\mu$ calculation process (4) carried out by the characteristic calculation means of the present embodiment, a function $\mu 1(Vb)$ in which the influence of the substrate voltage Vb is taken into consideration is added to the function $\mu(N, T, Ev)$ obtained in the prior art. Here, the form of the function $\mu 1(Vb)$ can be obtained not only from empirical knowledge and experiment data but also based on statistical methods such as the least squares method. For example, the function $\mu(N, T, Ev)$ is given by the above-stated equation (7), and the function $\mu 1(Vb)$ is given by a constant multiple aVb of the substrate voltage Vb. When the function $\mu 1(Vb)$ is defined by aVb, it is desirable to obtain the constant a by the least squares method.

A simulation method with the above-described MOSFET structure simulator will be explained with reference to the flow chart shown in FIG. 1.

First, in step S101, the conditions required for the simulation such as the shape of the semiconductor device, the distribution of impurities, temperature, input voltage, and the like are input to the input means.

Next, to have the characteristic calculation means carry out prescribed calculations, in step S102, the semiconductor device is first divided into meshes. Second, in step S103, the initial values of the electric potential $\psi$, electron density n, and hole density p at each mesh point are set based on the conditions defined in the simulation conditions input process (step S101). Third, in step S104, the vertical electric field Ev of the semiconductor device is calculated from the electric potential $\psi$, electron density n, and hole density p.

Next, in step S105, the carrier mobility $\mu$ is calculated from the impurity concentration N, temperature T of the semiconductor device, vertical electric field Ev, and the substrate voltage Vb. Next, in step S106, the electric potential $\psi$, electron density n, and hole density p at each mesh point are calculated from the vertical electric field Ev and the carrier mobility $\mu$. Next, in step S107, the electron current density Jn and hole current density Jp are calculated from the electric potential $\psi$, electron density n, hole density p, and carrier mobility $\mu$ at each mesh point calculated in, the previous process using equations (4) and (5). Next, in step S108, the value of the electric current that flows through each terminal is calculated from the electron current density Jn and hole current density Jp calculated in the previous process.

Next, it is judged whether the value of the current calculated in the previous process has converged or not in the judging means. To accomplish this, it is judged first whether the difference between the amount of the incoming current and the amount of the outgoing current lies in a prescribed convergence condition range or not (step S109). If the difference does not lie in the prescribed convergence condition range, the characteristic value calculation is repeated from the vertical electric field calculation process (step 104) using the electric potential $\psi$, electron density n, and hole density p obtained in the electric potential $\psi$, electron density n, and hole density p calculation process (step S106). If the difference lies in the prescribed convergence condition range, the device characteristic of the semiconductor device is evaluated using the electric current value.

The simulation information and the characteristic value of the semiconductor device obtained in the previous processes are output and displayed by an output device inside the simulator or another output device.

Figure 2:
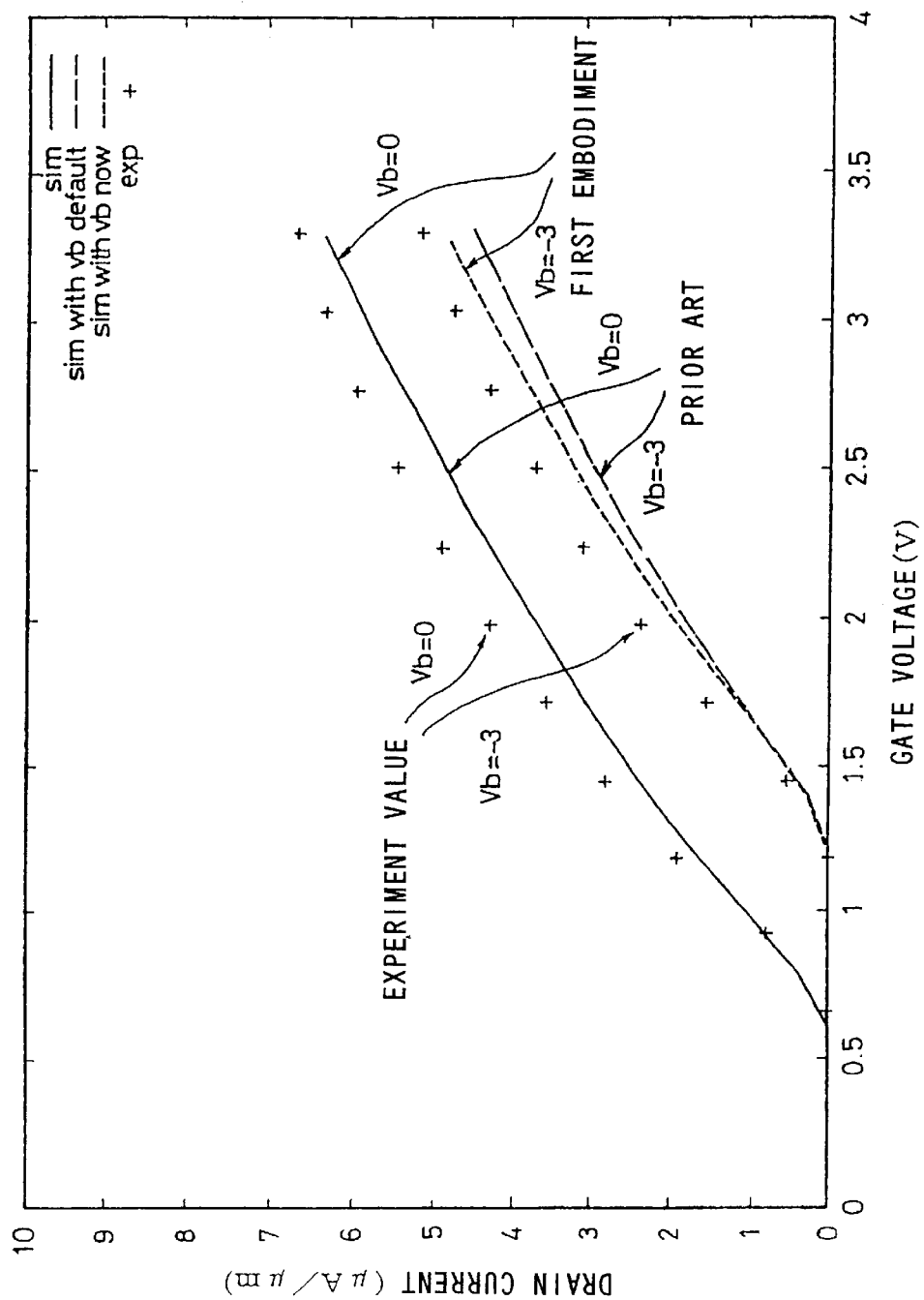
FIG. 2 shows the current-voltage characteristic of the simulation result according to the first embodiment.

According to the simulation method and simulator of the present embodiment, the term whose argument is the substrate voltage Vb is added to the carrier mobility $\mu$ calculation function used in the carrier mobility $\mu$ calculation process. As a result, as shown in FIG. 2, the carrier mobility $\mu$ that depends on the substrate voltage Vb can be reproduced.

Second Embodiment

A simulator according to the second embodiment will now be explained. This simulator also has an input means to which simulation conditions such as the shape of the semiconductor device, the distribution of impurities, temperature, input voltage, and the like are input, a characteristic calculation means which calculates the device characteristics of the semiconductor device by solving prescribed equations of device physics based on the distribution information from the input setting means, and a judging means which judges whether the characteristics value calculated by the characteristic calculation means has converged or not as the simulator according to the first embodiment. This simulator further has a matching means which judges whether the calculated electric current value agrees with the measured electric current value. In this way, the device characteristic can be simulated with a higher degree of accuracy.

Figure 3:
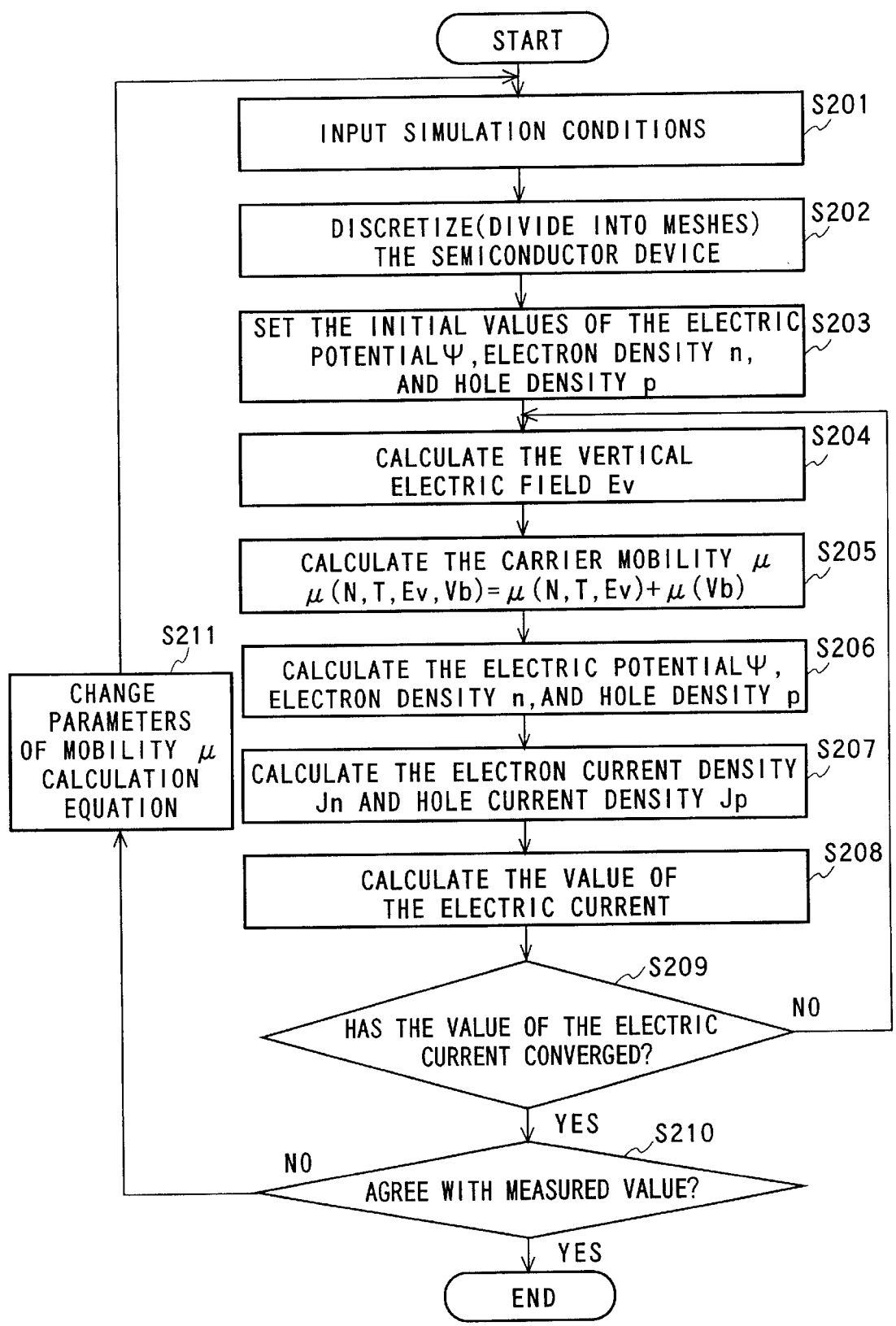
FIG. 3 shows a flow chart for operating the semiconductor device simulator according to the second embodiment.

A simulation method with the above-described MOSFET structure simulator will be explained with reference to the flow chart shown in FIG. 3. Those processes that are substantially identical to the processes used in the simulation method of the first embodiment will not be explained again in what follows.

First, the value of the electric current is calculated in steps S201 through 209 that are identical to the steps S101 through 109 of the first embodiment.

In the simulation method of the present embodiment, it is further judged whether the calculated value of the current agrees with the measured value of the current (step S210). If it is judged that the calculated value of the current does not agree with the measured value of the current in the agreement judging process (step S210), the parameters of the carrier mobility $\mu$ calculation equation used in the carrier mobility $\mu$ calculation process (step S205) are changed in the parameter change process (step S211). For example, when equation (7) is used as the carrier mobility $\mu$ calculation equation, the parameters b, c1, c2, and d are changed. The parameter change process may be performed by the characteristic calculation means or matching means. After the parameter change process (step S211) is completed, steps 201 through 209 are repeated.

Figure 4:
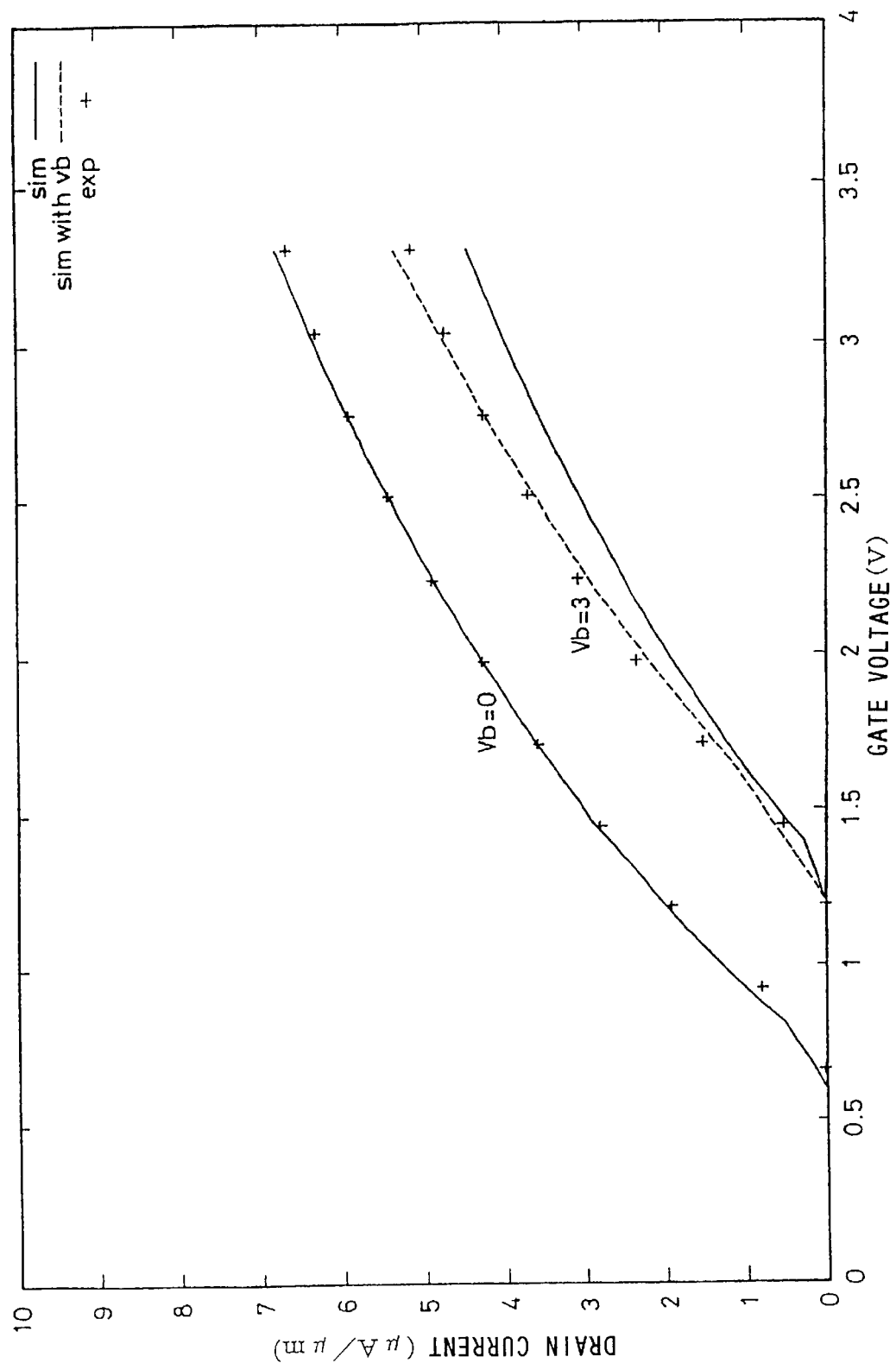
FIG. 4 shows the current-voltage characteristic of the simulation result according to the second embodiment.

According to the simulation method and simulator of the present embodiment, when the calculated value of the current does not agree with the measured value of the current, the parameters are changed, and the sequence from the simulation conditions input process to the agreement judging process is repeated. Therefore, as shown in FIG. 4, the values of the current obtained by the simulation match the measured values of the current very well.

Third Embodiment

Next, a simulator according to the third embodiment will be explained. This simulator has substantially the same configuration as the simulator according to the first embodiment. That is, this simulator also has an input means to which simulation conditions such as the shape of the semiconductor device, the distribution of impurities, temperature, input voltage, and the like are input, a characteristic calculation means which calculates the device characteristics of the semiconductor device by solving prescribed equations of device physics based on the distribution information from the input setting means, and a judging means which judges whether the characteristics value calculated by the characteristic calculation means has converged or not as the simulator according to the first embodiment. This simulator calculates the carrier mobility using the electric field on the insulation material/semiconductor interface. In this respect, this simulator differs from the simulators according to the first and second embodiments.

Figure 5:
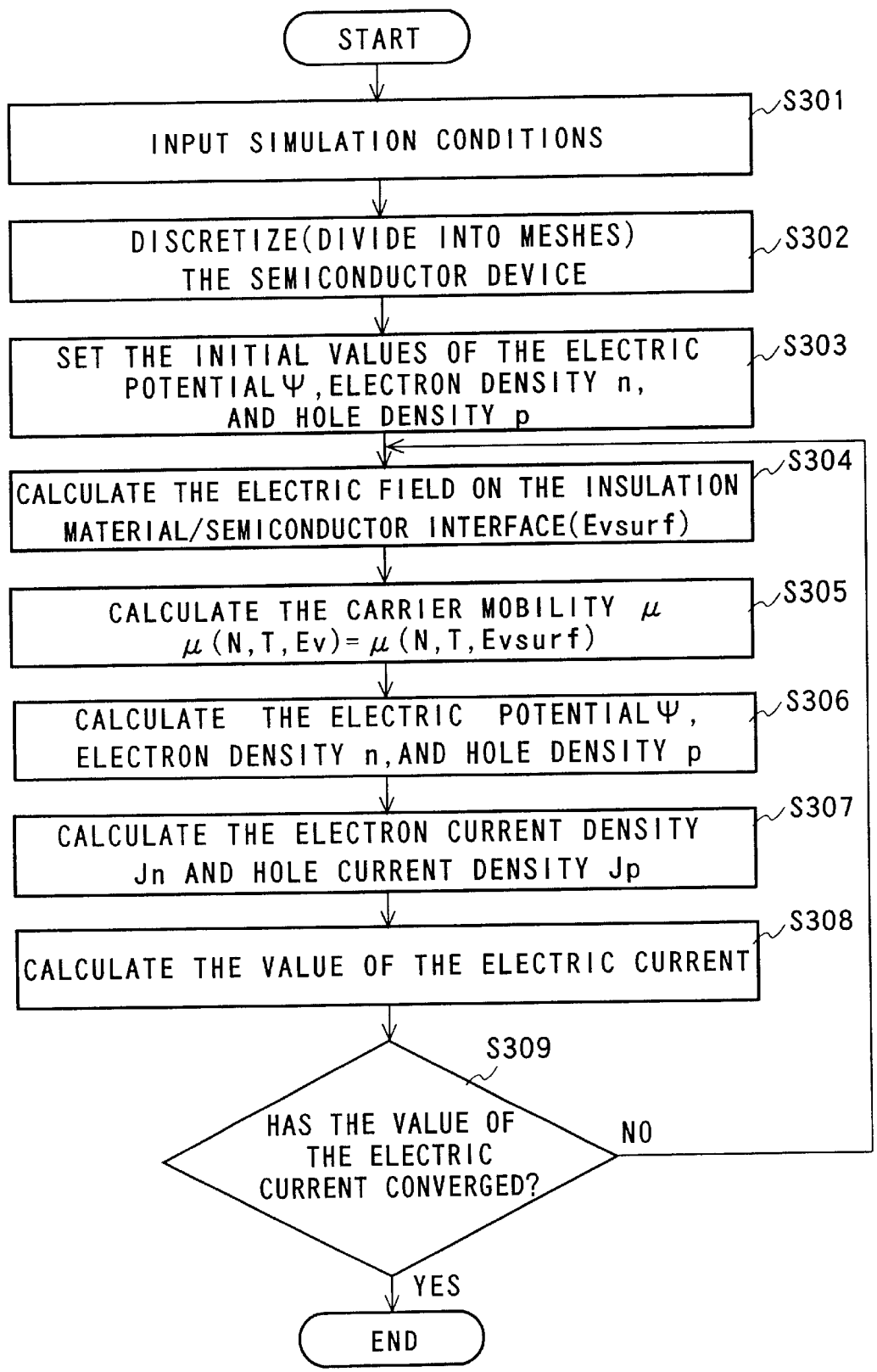
FIG. 5 shows a flow chart for operating the semiconductor device simulator according to the third embodiment.

Next, a simulation method with the above-described MOSFET structure simulator will be explained with reference to the flow chart shown in FIG. 5. Those processes that are substantially identical to the processes used in the simulation method of the first embodiment will not be explained again in what follows.

First, the initial values of the electric potential $\psi$, electron density n, and hole density p are set in steps S101 through S103 that are identical to steps S301 through S303 of the first embodiment.

Next, in step S304, the electric field on the insulation material/semiconductor interface is calculated. After this, in step S305, the carrier mobility at each mesh point is calculated using the electric field on the insulation material/semiconductor interface.

Moreover, in steps S306 through S309 that are identical to steps S106 through S109 of first embodiment, the values of the current are calculated and the convergence of the values of the current is judged.

According to the simulation method and simulator of the present embodiment, the amount of change of the vertical electric field in the neighborhood of the insulation material/semiconductor interface, which is caused by the application of the substrate voltage, can be reduced. As a result, the current characteristic dependent on the substrate voltage can be reproduced.

Fourth Embodiment

Next, a simulator according to the fourth embodiment will be explained. This simulator also has an input means to which simulation conditions such as the shape of the semiconductor device, the distribution of impurities, temperature, input voltage, and the like are input, a characteristic calculation means which calculates the device characteristics of the semiconductor device by solving prescribed equations of device physics based on the distribution information from the input setting means, and a judging means which judges whether the characteristics value calculated by the characteristic calculation means has converged or not as the simulator according to the third embodiment. This simulator further has a matching means which judges whether the calculated electric current value agrees with the measured electric current value. In this way, the device characteristic can be simulated with a higher degree of accuracy.

Figure 6:
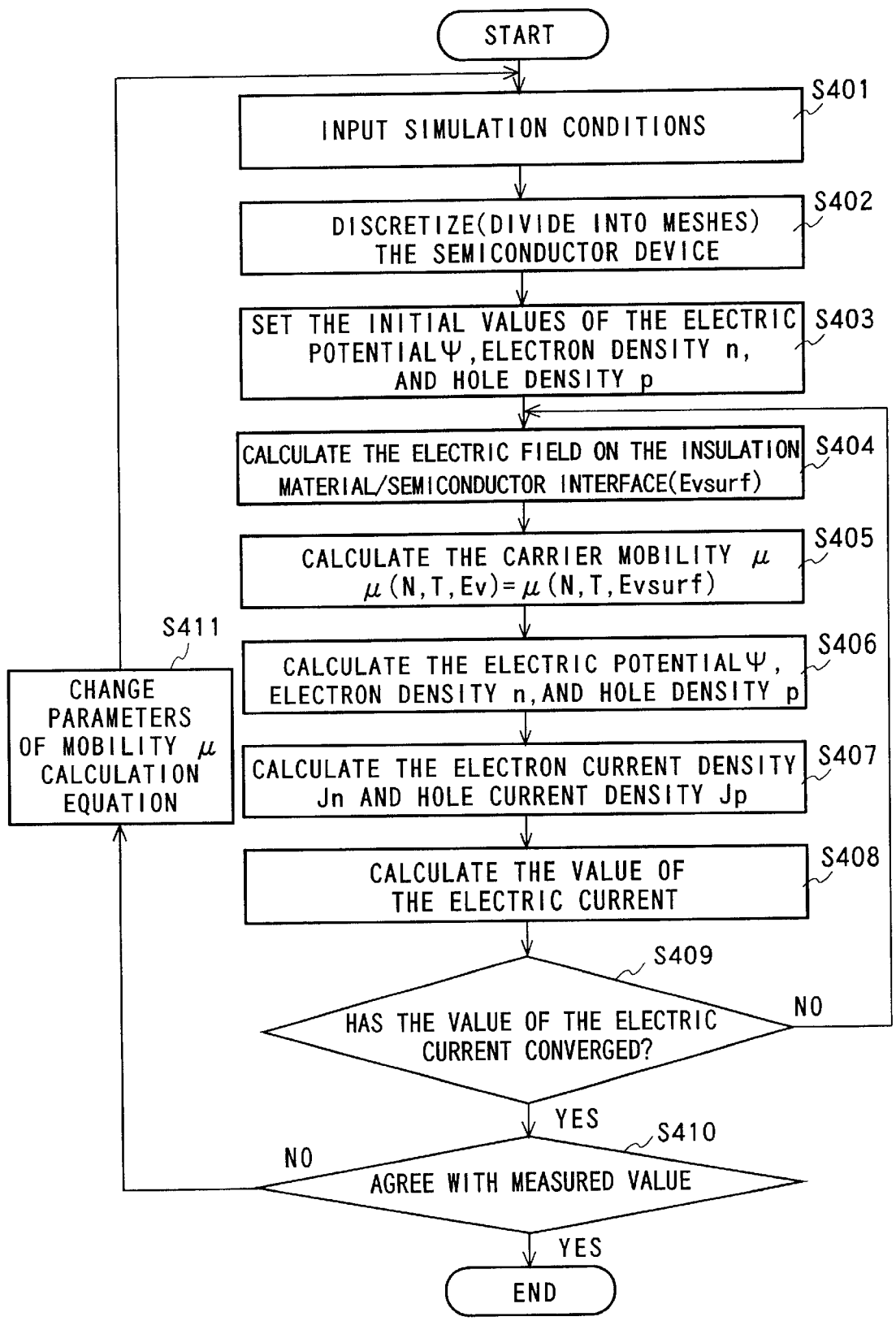
FIG. 6 shows a flow chart for operating the semiconductor device simulator according to the fourth embodiment.

Next, a simulation method with the above-described MOSFET structure simulator will be explained with reference to the flow chart shown in FIG. 6. Those processes that are substantially identical to the processes used in the simulation method of the third embodiment will not be explained again in what follows.

First, the value of the electric current is calculated in steps S401 through 409 that are identical to the steps S301 through S309 of the first embodiment.

In the simulation method of the present embodiment, it is further judged whether the calculated value of the current agrees with the measured value of the current (step S410). If it is judged that the calculated value of the current does not agree with the measured value of the current in the agreement judging process (step S410), the parameters of the carrier mobility $\mu$ calculation equation used in the carrier mobility $\mu$ calculation process (step S405) are changed in the parameter change process (step S411). For example, when equation (7) is used as the carrier mobility $\mu$ calculation equation, the parameters b, c1, c2, and d are changed. The parameter change process may be performed by the characteristic calculation means or matching means. After the parameter change process (step S411) is completed, steps 401 through 409 are repeated.

According to the simulation method and simulator of the present embodiment, as the simulation method and simulator of the third embodiment, the amount of change of the vertical electric field in the neighborhood of the insulation material/semiconductor interface, which is caused by the application of the substrate voltage, can be reduced. As a result, the current characteristic dependent on the substrate voltage can be reproduced.

Figure 7:
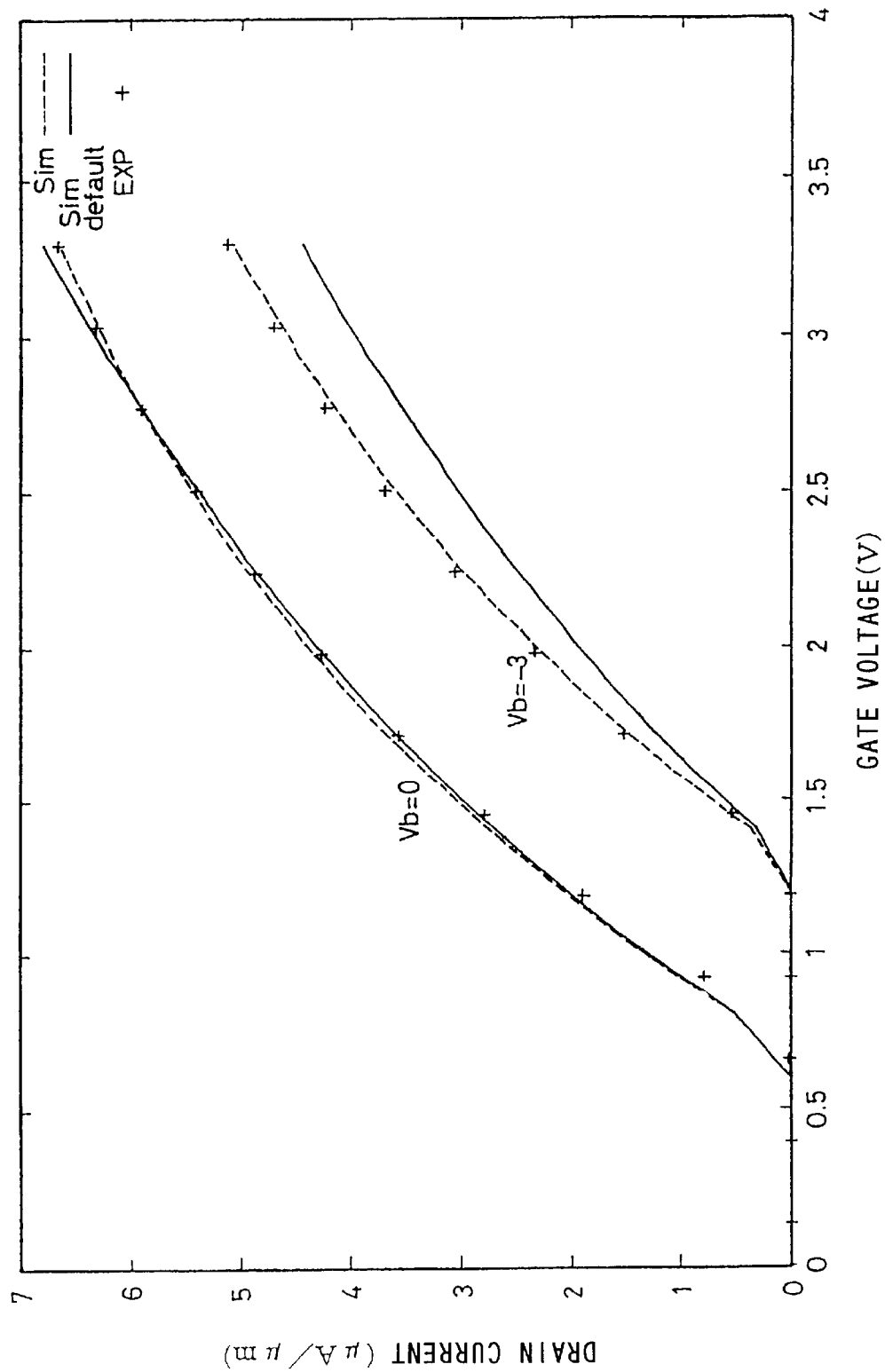
FIG. 7 shows the current-voltage characteristic of the simulation result according to the fourth embodiment.
Figure 8:
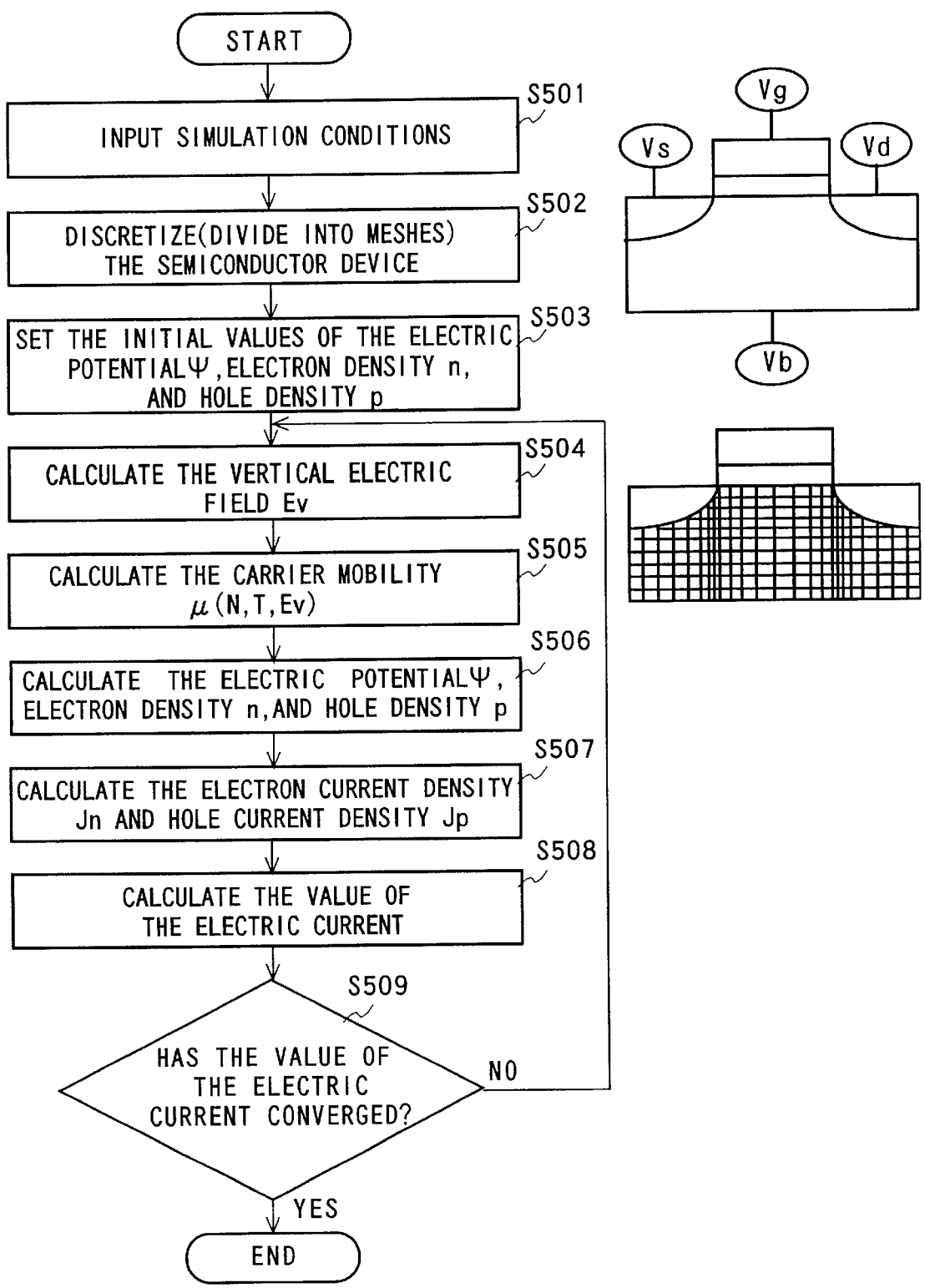
FIG. 8 shows a flow chart for operating the MOSFET semiconductor device simulator according to the prior art.
Figure 9:
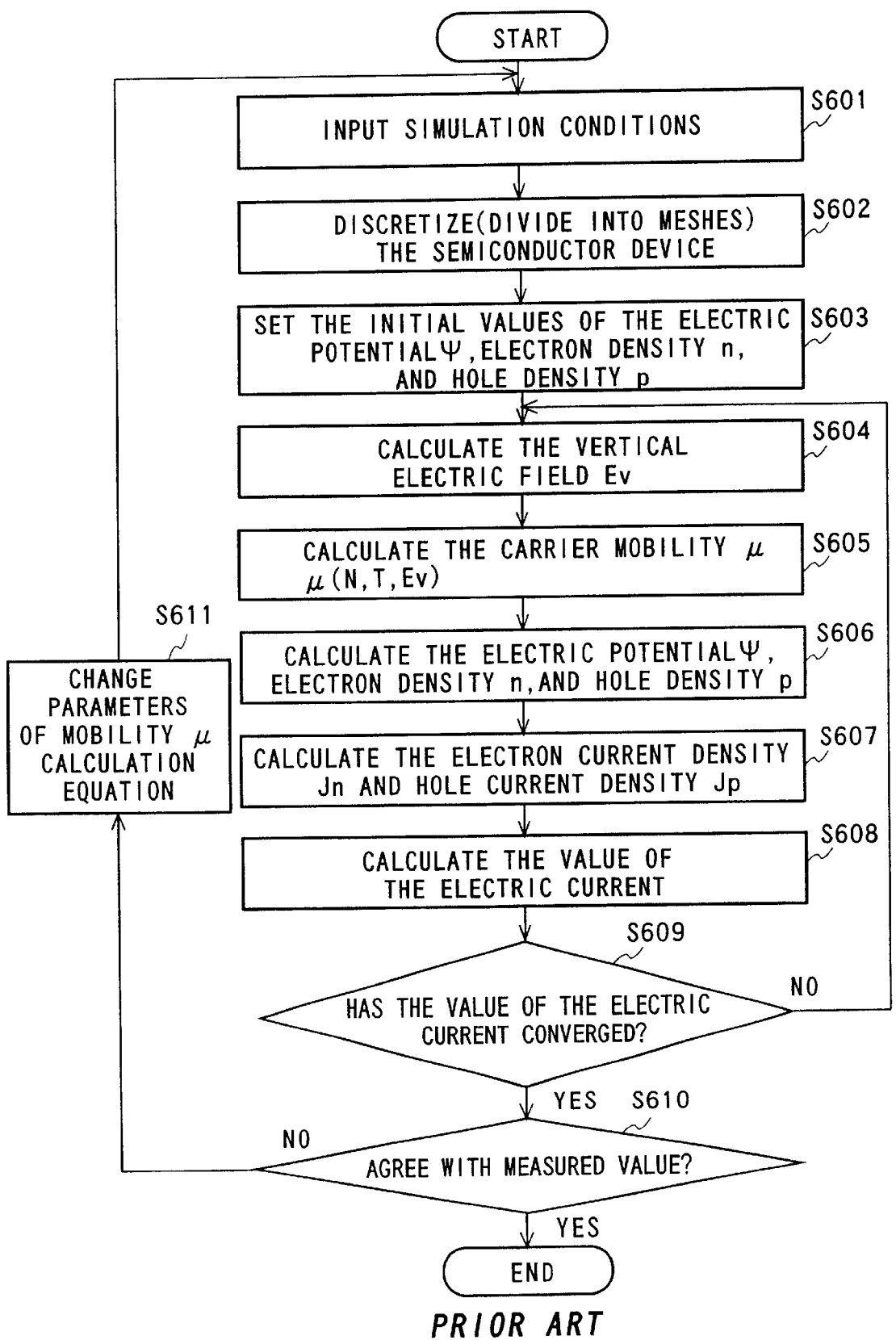
FIG. 9 shows a flow chart for operating the matching means of the semiconductor device simulator according to the prior art.
Figure 10:
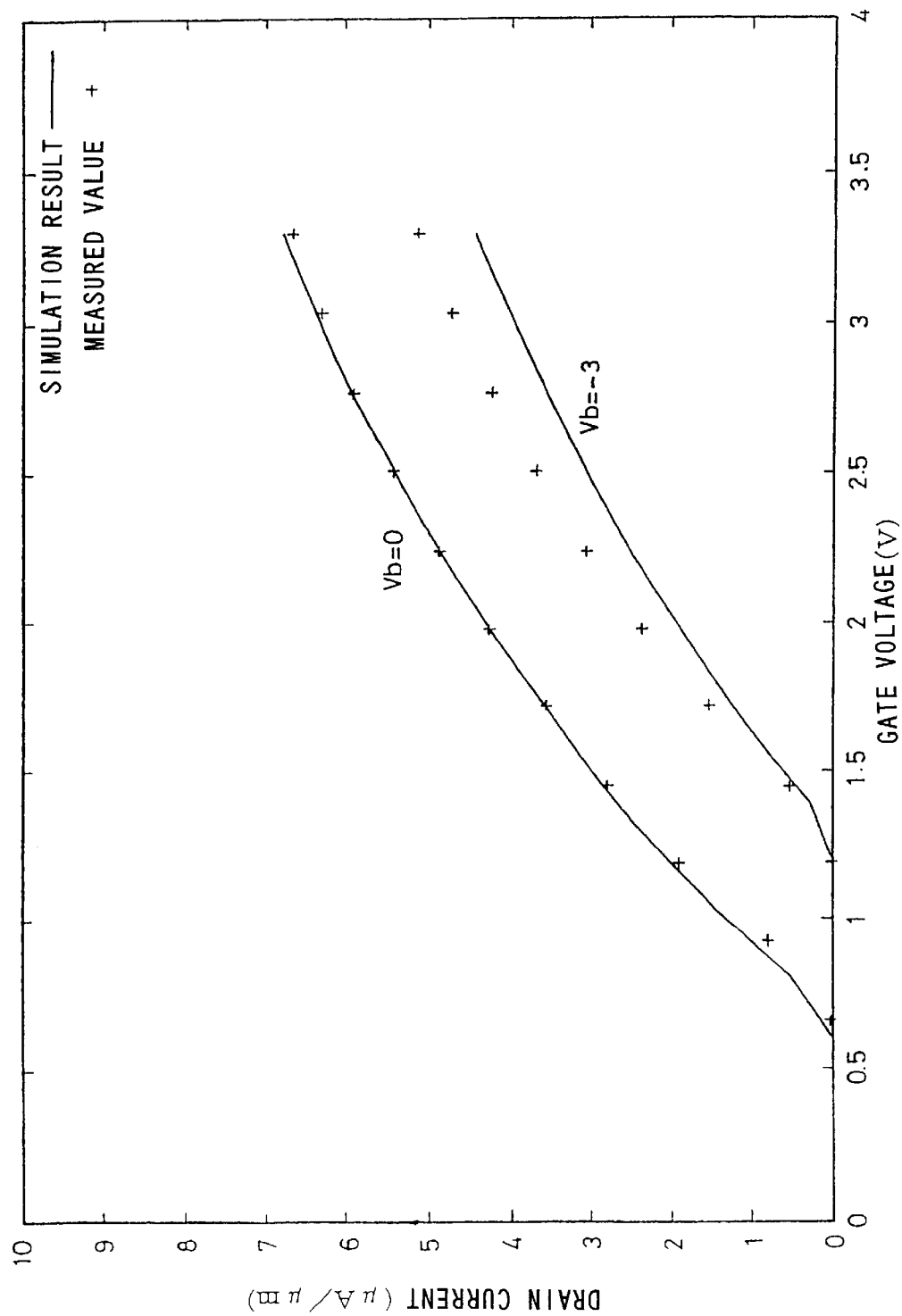
FIG. 10 shows the current-voltage characteristic of the simulation result in which valued measured from an N-type MOSFET and a matching means were used according to the prior art.
Figure 11:
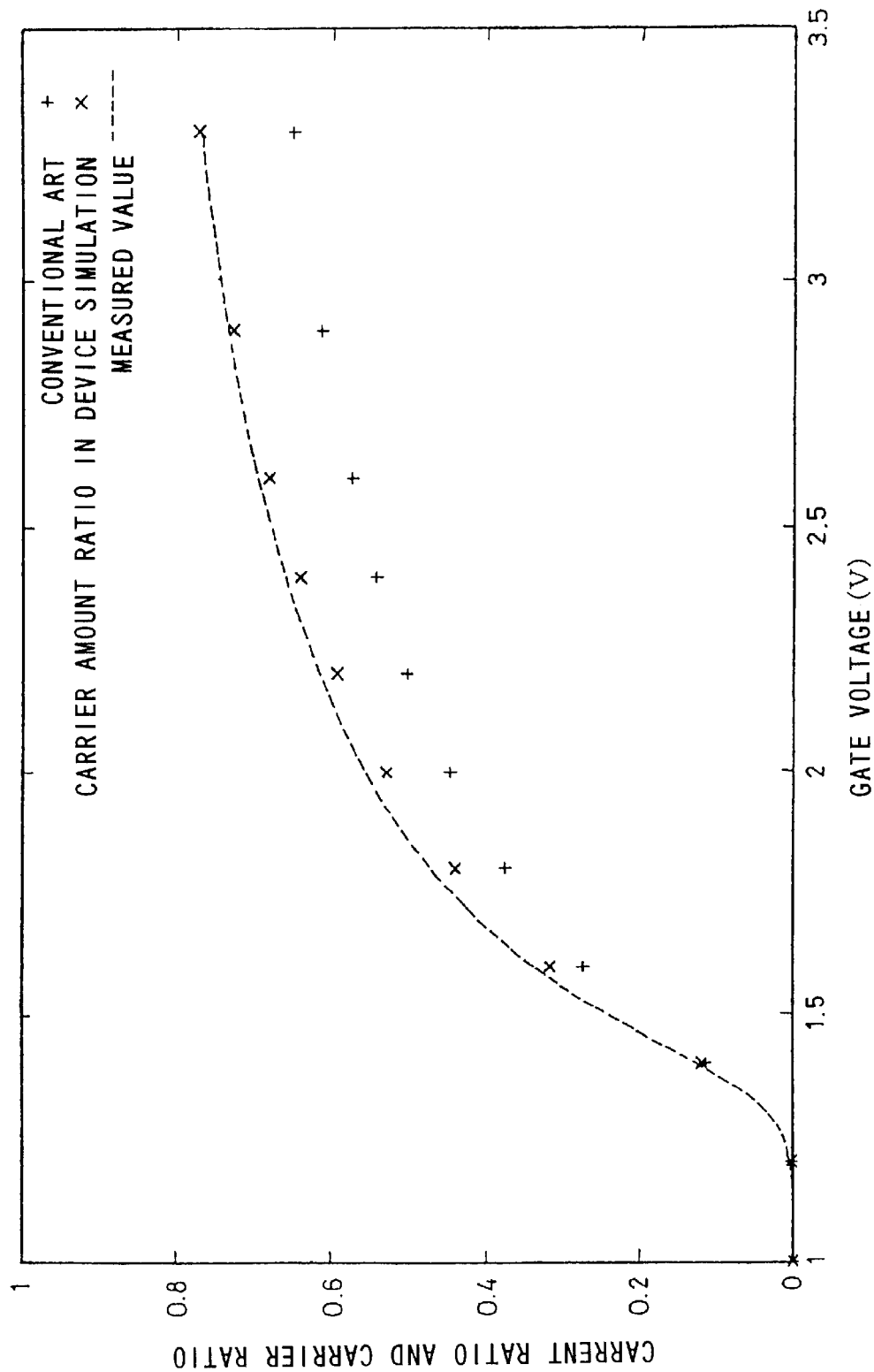
FIG. 11 shows the current ratio and the carrier ratio in the case the substrate voltage Vb is 0V and in the case the substrate voltage Vb is −3V according to the prior art.
Figure 12:
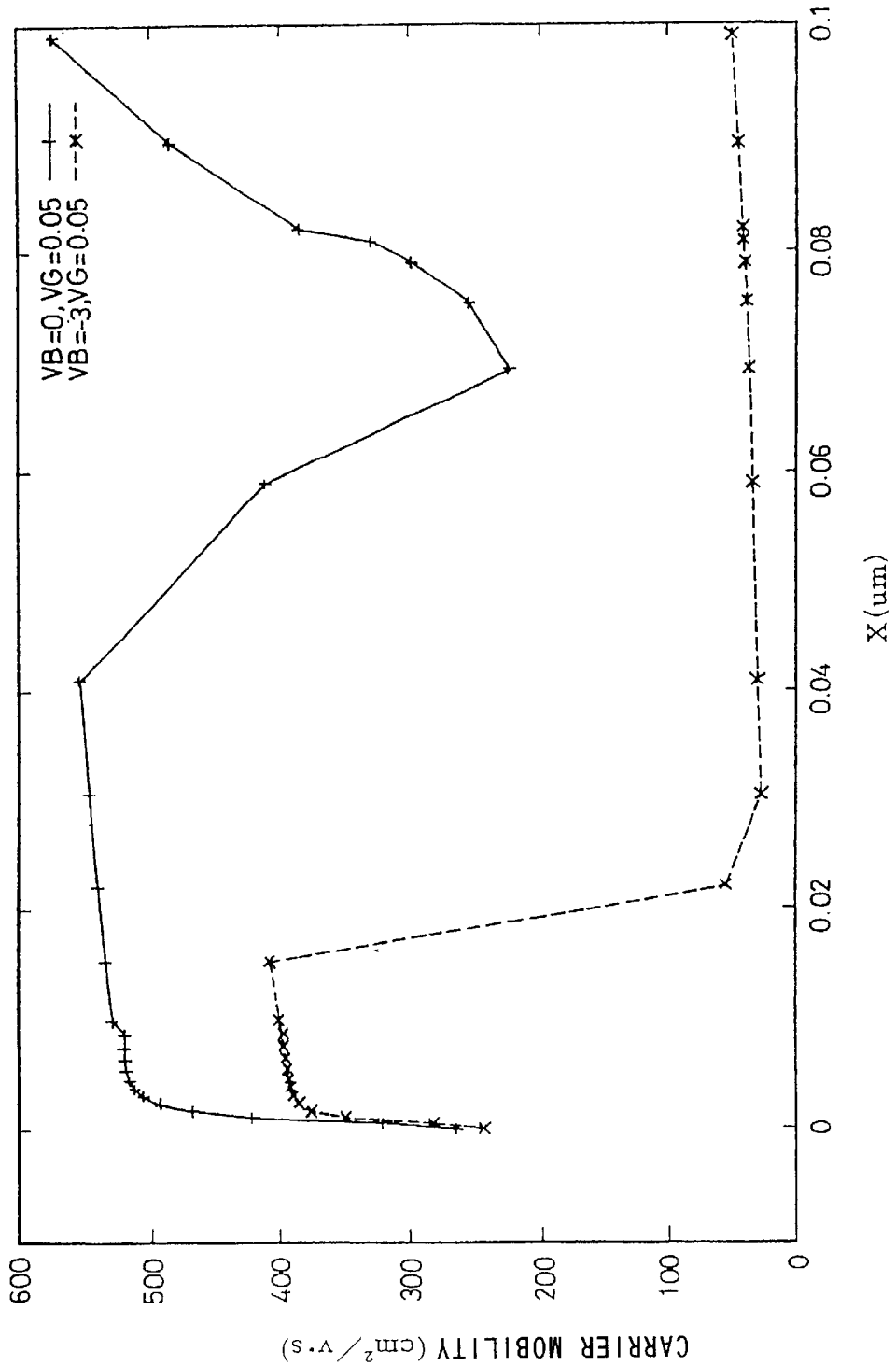
FIG. 12 shows the distribution of the mobility $\mu$ with respect to the distance X from the insulation material/semiconductor interface according to the prior art.
Figure 13:
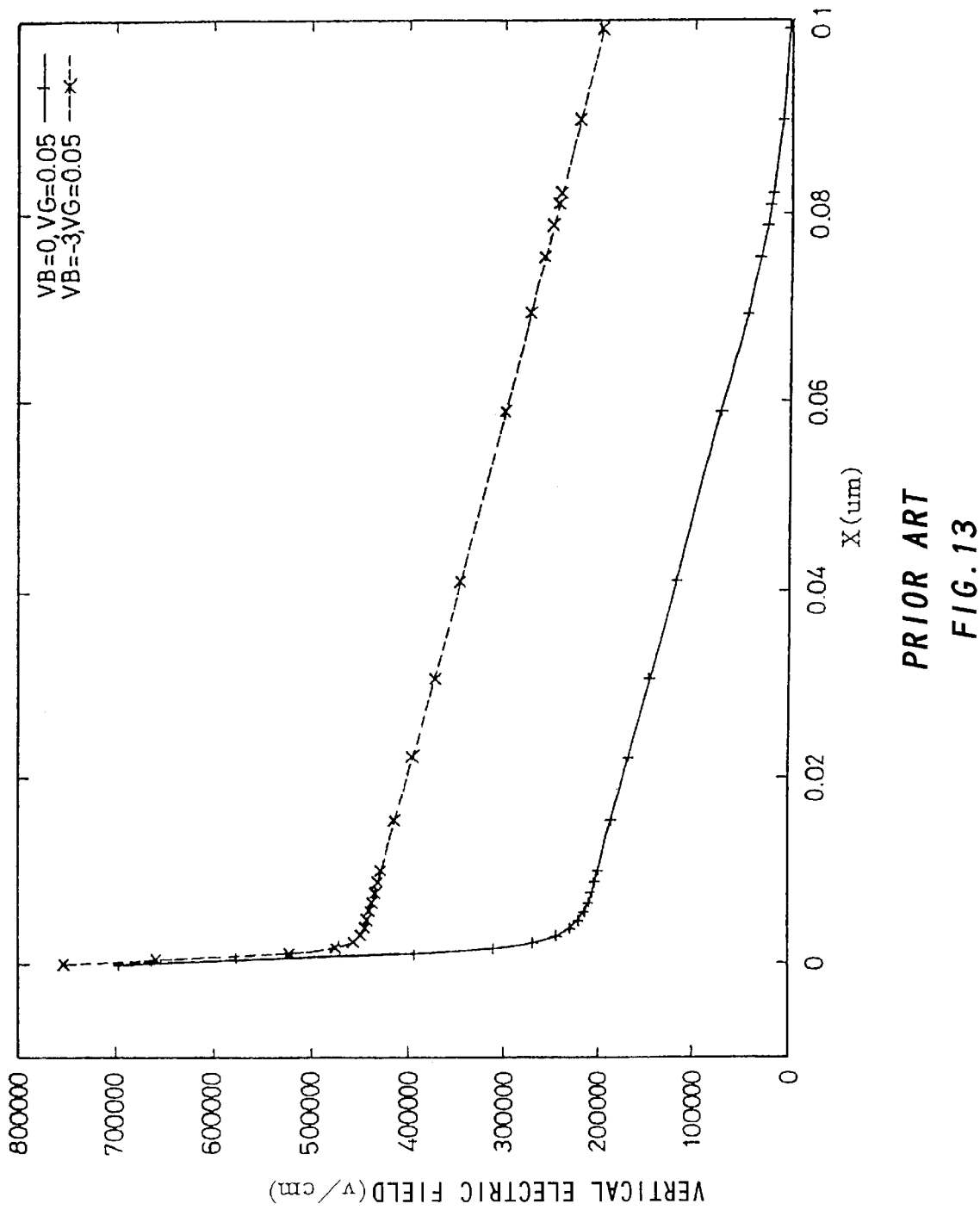
FIG. 13 shows the distribution of the vertical electric field Ev with respect to the distance X from the insulation material/semiconductor interface according to the prior.art.

Moreover, according to the simulation method and simulator of the present embodiment, just like the simulation method and simulator of the second embodiment, when the calculated value of the current does not agree with the measured value of the current, the parameters are changed, and the sequence from the simulation conditions input process to the agreement judging process is repeated. Therefore, as shown in FIG. 7, the values of the current obtained by the simulation agree with the measured values of the current very well.

So far, the present invention has been explained with reference to the attached drawings using preferred embodiments. However, the range of technical applications of the present invention is not limited to these embodiments. Other variations and modifications of the above-described embodiments should be evident to those skilled in the art. Accordingly, it is intended that such alterations and modifications be included within the scope and spirit of the present invention.

For example, in the embodiments of the present invention, the function $\mu(N, T, Ev)$ for obtaining the carrier mobility $\mu$ is given by the above-stated equation (7), and the function $\mu1(Vb)$ is defined by aVb, where a is a constant and Vb is the substrate voltage. However, the range of technical application of the present invention is not limited to this one example. The present invention can be applied in the same manner by selecting a suitable function for $\mu(N, T, Ev)$ and selecting an optimal function that has the substrate voltage Vb as the argument for $\mu1(Vb)$.

Thus, according to the present invention, a term whose argument is the substrate voltage is added to the mobility calculation function used in the carrier mobility $\mu$ calculation process. As a result, change in the carrier mobility that depends on the substrate voltage can be reproduced.

Moreover, according to present embodiment, the amount of change of the vertical electric field in the neighborhood of the insulation material/semiconductor interface, which is caused by the application of the substrate voltage, can be reduced. As a result, the current characteristic dependent on the substrate voltage can be reproduced.

What is claimed is:

1. A MOSFET simulation method for calculating a characteristic value of a MOSFET to be simulated, comprising the steps of:

(a) inputting simulation conditions including various physical and operational parameters of said MOSFET, said physical parameters including an impurity concentration N of said MOSFET and said operational parameters including a temperature T, a vertical electric field Ev, and a substrate voltage Vb ascribed to said MOSFET;

(b) numerically calculating an electric potential $\psi$, an electron density n, a hole density p, and carrier mobility $\mu$ inside said MOSFET from initial values thereof and said simulation conditions, and (c) using said electric potential $\psi$, said electron density n, said hole density p, and said carrier mobility $\mu$ to determine said characteristic value, wherein step (b) comprises calculating said carrier mobility $\mu$ from the following equation:

$$\mu(N, T, Ev, Vb) = \mu0(N, T, Ev) + \mu1(Vb); \text{ and}$$

wherein step (b) further comprises calculating said electric potential $\psi$, said electron density n, said hole density p using said carrier mobility $\mu$ by solving the following system of simultaneous equations:

Poisson's equation, $$\text{div}(-\epsilon \text{grad}(\psi)) = q(p - n + Nd - Na),$$

Equation of continuity of electrons, $$\text{div}(Jn) = q(R - G),$$

Equation of continuity of holes, $$\text{div}(Jp) = -q(R - G),$$

Electron transport equation, $$Jn = -q^*(\mu n^* n^* \text{grad}(\psi) - Dn^* \text{grad}(n)), \text{ and}$$

Hole transport equation, $$Jp = -q^*(\mu p^* p^* \text{grad}(\psi) + Dp^* \text{grad}(p)),$$

where $\epsilon$ is a permittivity of a medium, Nd is a donor density, Na is an acceptor density, R is a carrier re-coupling amount, G is a carrier generation amount, $\mu n$ is an electron mobility, $\mu p$ is a hole mobility, Dn is an electron diffusion coefficient, Dp is a hole diffusion coefficient, Jn is an electron current density, Jp is a hole current density, and q is a unit electric charge.

2. A MOSFET simulation method as claimed in claim 1, wherein said $\mu0(N, T, Ev)$ is given by $$1/\mu0(Ev, N, T) = 1/(b/Ev + c1^*N^{c2}/(T^*Ev)) + (Ev)^2/d + 1/\mu2(N, T)$$

where b, c1, c2, and d are prescribed constants, and $\mu2(N, T)$ is a prescribed function that depends on N and T.

3. A MOSFET simulation method as claimed in claim 2, wherein said $\mu1(Vb)$ is given by $$\mu1(Vb) = aVb,$$

where a is a prescribed constant.

4. A MOSFET simulation method as claimed in claim 2, wherein said vertical electric field is a surface electric field on an interface of an insulating material of said MOSFET and a semiconductor.

5. A MOSFET simulation method as claimed in claim 1, wherein said characteristic value is current through the MOSFET.

6. A MOSFET simulation method as claimed in claim 1, in combination with the step of making the MOSFET following simulation thereof.

7. A MOSFET simulation method as claimed in claim 1, wherein steps (b) and (c) are conducted iteratively until they converge on a value for the current, as the characteristic value.

8. A MOSFET simulation method as claimed in claim 7, in combination with the step of making the MOSFET following simulation thereof.

\* \* \* \* \*